(12) United States Patent
Dickey

(10) Patent No.: US 12,132,471 B2
(45) Date of Patent: Oct. 29, 2024

(54) LIGHTNING PROTECTION FOR POWER MOSFETs

(71) Applicant: Hamilton Sundstrand Corporation, Charlotte, NC (US)

(72) Inventor: John Dickey, Caledonia, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 110 days.

(21) Appl. No.: 17/887,153

(22) Filed: Aug. 12, 2022

(65) Prior Publication Data

US 2024/0056069 A1  Feb. 15, 2024

(51) Int. Cl.
| G05F 1/569 | (2006.01) |
| H02H 9/02 | (2006.01) |
| H03K 17/082 | (2006.01) |

(52) U.S. Cl.
CPC ......... *H03K 17/0822* (2013.01); *G05F 1/569* (2013.01); *H02H 9/025* (2013.01)

(58) Field of Classification Search
CPC .. H03K 17/12; H03K 17/122; H03K 17/0822; G05F 1/569; H02H 9/025; H02H 3/20; H02H 9/00
USPC .................................................. 361/56, 91.1
See application file for complete search history.

(56) References Cited

U.S. PATENT DOCUMENTS

| 5,153,453 | A | * | 10/1992 | Walters | ...................... | G05F 3/18 327/584 |
| 5,784,236 | A | | 7/1998 | Tardiff et al. | | |
| 6,385,028 | B1 | * | 5/2002 | Kouno | ............... | H03K 17/0822 361/111 |
| 6,614,633 | B1 | * | 9/2003 | Kohno | ............... | H03K 17/0822 361/111 |
| 6,888,711 | B2 | | 5/2005 | Kohno | | |
| 8,780,516 | B2 | * | 7/2014 | Wagoner | ................. | H02M 1/08 361/111 |
| 9,007,730 | B2 | | 4/2015 | Schmid et al. | | |
| 9,128,119 | B2 | | 9/2015 | Said | | |
| 9,819,175 | B2 | | 11/2017 | Dickey et al. | | |
| 9,908,489 | B2 | | 3/2018 | Shipley et al. | | |
| 10,594,133 | B2 | | 3/2020 | Eberts et al. | | |

(Continued)

FOREIGN PATENT DOCUMENTS

| EP | 2757688 A1 | 7/2014 |
| EP | 3540771 A1 | 9/2019 |

OTHER PUBLICATIONS

Carlisle Interconnect Technologies, "TVS Design Guide," 23 pages.

(Continued)

*Primary Examiner* — Danny Nguyen

(57) ABSTRACT

A power system includes a field effect transistor (FET) with a first terminal, a gate terminal, and a third terminal. A Zener diode is connected in series between the first terminal of the FET and the gate terminal of the FET. The Zener diode is oriented to allow current through the Zener diode only if its voltage difference is at or over the Zener voltage of the Zener diode. A capacitor is connected in parallel with the Zener diode. The capacitor is configured to raise gate drive current of the FET during a rising edge of a lightning transient and thereby reduce voltage drop across the FET faster than the Zener diode can do on its own.

20 Claims, 3 Drawing Sheets

(56) References Cited

U.S. PATENT DOCUMENTS

| | | | |
|---|---|---|---|
| 2003/0086227 A1* | 5/2003 | Coiret ................. | H03K 17/168 |
| | | | 361/91.5 |
| 2008/0054325 A1* | 3/2008 | Takahashi ........... | H01L 29/7821 |
| | | | 257/E29.136 |
| 2015/0171767 A1 | 6/2015 | Odaka et al. | |
| 2016/0204777 A1* | 7/2016 | Greither ............... | H03K 17/122 |
| | | | 327/434 |
| 2019/0207598 A1* | 7/2019 | Yu ...................... | H03K 17/0822 |

OTHER PUBLICATIONS

European Search Report dated Dec. 6, 2023, issued during the prosecution of European Patent Application No. 23185383.9.

* cited by examiner

LIGHTNING PROTECTION FOR POWER MOSFETs

BACKGROUND

1. Field

The present disclosure relates to lightning protection, and more particularly to lightning protection for power MOSFETs such as in direct current (DC) solid state power controller (SSPC) applications.

2. Description of Related Art

SSPCs switch loads on and off on command and when there is an overcurrent condition this has the potential to damage wiring. On normal installations, these SSPCs must be able to survive lightning impulses on the power wiring. Since lightning voltages can be very high and SSPCs are traditionally built using MOSFETs with limited voltage ratings, there must be some type of lightning protection system incorporated to ensure the lightning voltages on the wire do not exceed the ratings of the MOSFETs.

There have been various approaches for handling lightning transients to protect power MOSFETs. Two of the most common methods are to either use high power transient suppressors across the MOSFETs that break down at a lower voltage than the MOSFETs do and the second is to use much smaller power Zener diodes conducting to the MOSFET gate to cause the MOSFET to turn partially on during the lightning transient at a preset voltage that is lower than the damage voltage for the MOSFET. This results in configuring the output MOSFET as a power Zener so that the FET can protect itself by sending much of the lightning energy on down the wire toward the load.

The conventional techniques have been considered adequate for their intended purposes, but there is still the need for better ways to reduce the power dissipation the MOSFETs must handle during these transients. This disclosure provides a solution for this need.

SUMMARY

A power system includes a field effect transistor (FET) with a first terminal, a gate terminal, and a third terminal. The first terminal, gate terminal, and third terminal are configured for controlling electrical current passing between first terminal the third terminal based on voltage of the gate terminal. A Zener diode is connected in series between a first node and a second node, wherein the first node is connected to the first terminal of the FET and the second node is connected to the gate terminal of the FET. The Zener diode is oriented to allow current through the Zener diode from the first node to the second node only if a voltage difference between the first and second nodes is at or over a Zener voltage of the Zener diode. A capacitor is connected in parallel with the Zener diode between the first and second nodes. The capacitor is configured to raise gate drive current of the FET during a rising edge of a lightning transient and thereby reduce voltage drop across the FET faster than the Zener diode can do on its own.

The first terminal can be a drain of the FET. The third terminal can be a source of the FET. The capacitor can be configured to reduce total amount of energy the FET must dissipate by as much as 29% or more relative to if the capacitor were not included, e.g. when the first node is subject to a wave form with a Level 4 Waveform 2 Threat. The capacitor can be configured to reduce the total amount of energy the FET must dissipate by 29% or more relative to if the capacitor were not included when the first node is subject to a wave form with a Level 4 Waveform 4 Threat.

There need be no intervening resistors, capacitors, inductors, transistors, or diodes in a line connecting the first node and the first terminal of the FET. There need be no intervening resistors, capacitors, inductors, transistors, or diodes in a line connecting the second node and the gate terminal of the FET.

A diode can be connected in series between the Zener diode and the second node. The diode can be oriented to allow current from the first node to the second node, and to inhibit current from the second node to the first node. A load resistance can be connected to the third node. The capacitor, Zener diode, and FET can be configured to dissipate a lightning strike at the first node by shunting some lightning energy through the FET to the load resistance. A voltage source, e.g. a 28 V source, can be connected in series between the first node and the load resistance. A voltage source, e.g. a second voltage source, can be operatively connected to the second node for controlling the FET during normal operation. A resistor can be connected in series between the voltage source and the second node, e.g. wherein the voltage source is connected in series between the resistor and ground.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
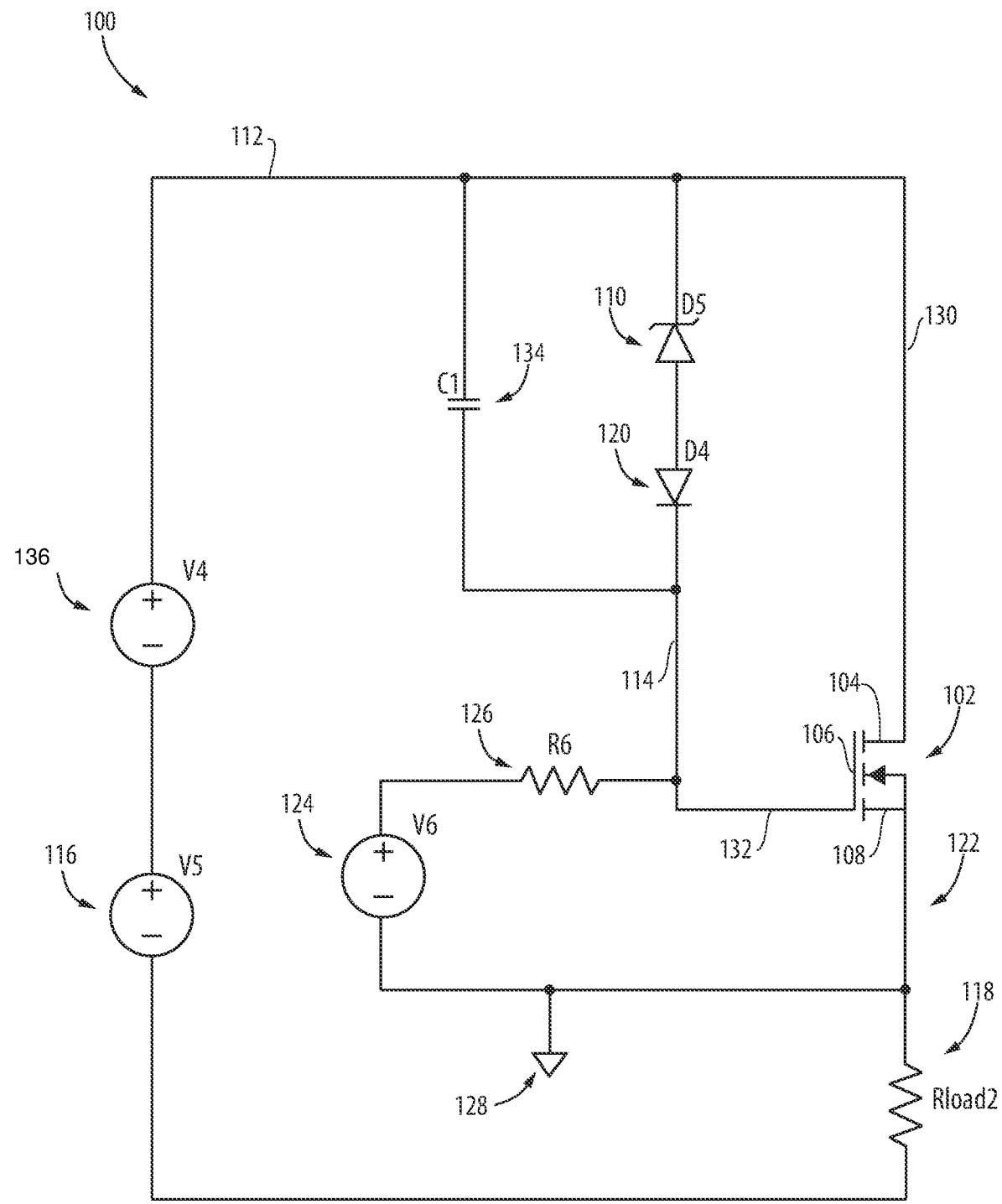
FIG. 1 is a schematic view of an embodiment of a power system constructed in accordance with the present disclosure, showing the field effect transistor (FET), and the capacitor and Zener Diode for transient protection of the FET.

Reference will now be made to the drawings wherein like reference numerals identify similar structural features or aspects of the subject disclosure. For purposes of explanation and illustration, and not limitation, a partial view of an embodiment of a power system in accordance with the disclosure is shown in FIG. 1 and is designated generally by reference character 100.

Other embodiments of systems in accordance with the disclosure, or aspects thereof, are provided in FIGS. 2-3, as will be described. The systems and methods described herein can be used to reduce energy dissipation in transient voltage events for power MOSFETS and the like, relative to conventional systems and methods.

The power system 100, with transient protection such as for protecting against lightning strikes, includes a field effect transistor (FET) 102, which can be a MOSFET. The FET has a first terminal 104, a gate terminal 106, and a third terminal 108. The terminals 104, 106, 108 are configured for controlling electrical current passing between first terminal 104 the third terminal 108 based on voltage of the gate terminal 106. This allows solid state control of power from a primary voltage source 116, e.g. a 28 V source, to a load, e.g. load resistance 118 such as powered equipment aboard an aircraft. The voltage source 116 is connected in series between the first node 112 and the load resistance 118. The load resistance 118 is connected to a third node 122, which is connected to the third terminal 108. The first terminal 104 is a drain of the FET 102, and the third terminal 108 is a source of the FET, however other FET configurations can reverse this source/drain orientation without departing from the scope of this disclosure.

A voltage source 124, e.g. a second voltage source, is operatively connected to the second node 114 for controlling the FET 102 during normal operation. A resistor 126 is connected in series between the voltage source 126 and the second node 114, e.g. wherein the voltage source 124 is connected in series between the resistor 126 and ground 128.

A Zener diode 110 is connected in series between a first node 112 and a second node 114, wherein the first node 112 is connected to the first terminal 104 of the FET 102 and the second node 114 is connected to the gate terminal 106 of the FET 102. The Zener diode 110 is oriented to allow current through the Zener diode 110 from the first node 112 to the second node 114 only if the voltage difference between the first and second nodes 112, 114 is at or over the Zener voltage of the Zener diode 110. A diode 120, i.e. a non-Zener diode, is connected in series between the Zener diode 110 and the second node 114. The diode 120 is oriented to allow current from the first node 112 to the second node 114, and to inhibit current from the second 114 node to the first node 112.

There are no intervening components, e.g., resistors, capacitors, inductors, transistors, or diodes, in the line 130 connecting the first node 112 and the first terminal 104 of the FET 102. Similarly, there are no intervening components, e.g., resistors, capacitors, inductors, transistors, or diodes, in the line 132 connecting the second node 114 and the gate terminal 106 of the FET 102.

A capacitor 134 is connected in parallel with the Zener diode 110 between the first and second nodes 112, 114. The capacitor 134 is configured to raise gate drive current of the FET 102 during a rising edge of a transient and thereby reduce voltage drop across the FET 102 faster than the Zener diode 110 can do on its own. The transient can include a lightning transient, e.g., where the lightning voltage is indicated in FIG. 1 as a voltage source 136 connected to the first node 112.

The capacitor 134, Zener diode 110, and FET 102 are configured to dissipate a lightning strike at the first node 112 by shunting some lightning energy through the FET 102 to the load resistance 118. The capacitor 134 is configured to reduce total amount of energy the FET 102 must dissipate by 29% or more relative to if the capacitor 134 were not included in the system 100. The capacitor 134 can accomplish this, for example, when the first node 112 is subject to a wave form with a Level 4 Waveform 2 Threat. The capacitor can also accomplish this dissipation if the first node 112 is subject to a wave form with a Level 4 Waveform 4 Threat.

DO-160 has two tables for lightning threats. The first is the waveform which primarily is a group of similar waveforms with different time scales so Waveform 2 is a double exponential pulse and Waveform 4 is a much longer double exponential pulse. The much longer pulse caries much more energy than the short one. The second table is the level and this is the peak voltage and current that the pulse conforms to, i.e. depending on whether voltage limit or current limit is reached first. If the circuit series impedance is very low then the peak required current will be reached first but if the series circuit impedance is much higher, then the peak required voltage will be reached first.

Figure 2:
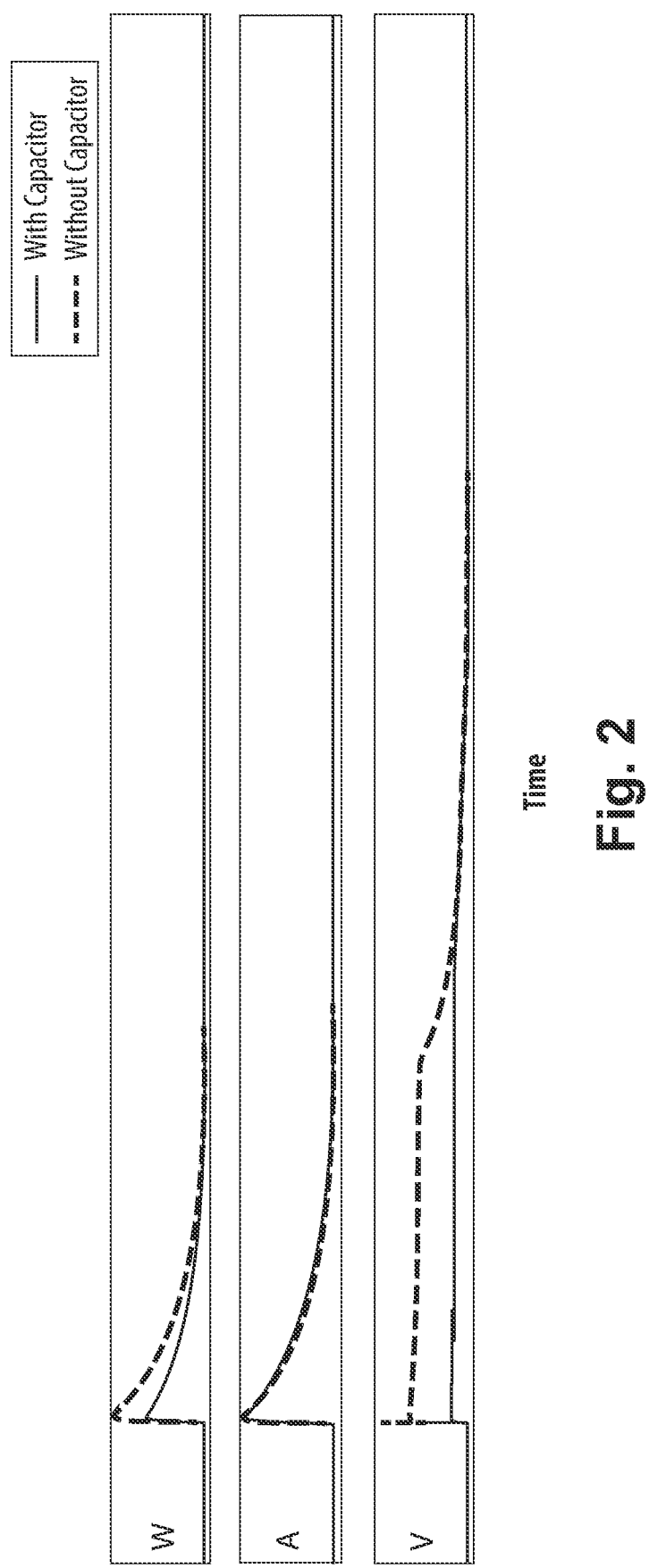
FIG. 2 is a set of three graphs showing power dissipation for a Level 4 Waveform 2 Threat for the power system of FIG. 1 and for a similar system without the capacitor for comparison, wherein the top graph plots the transient event in Watts over time, the middle graph plots the event in Amperes over time, and the bottom graph plots the event in Volts over time.

For a Level 4 Waveform 2 threat, FIG. 2 shows two traces for each of wattage, amperage, and voltage, wherein the higher trace in each represents performance of the system 100 but without the capacitor 134, and wherein the lower trace in each references performance of the system 100 with the capacitor 134 included. For power dissipation integrated over the time of the transient event shown, the system with the capacitor 134 dissipates at least 29% more power from the FET 102 than does the system 100 without the capacitor 134.

Figure 3:
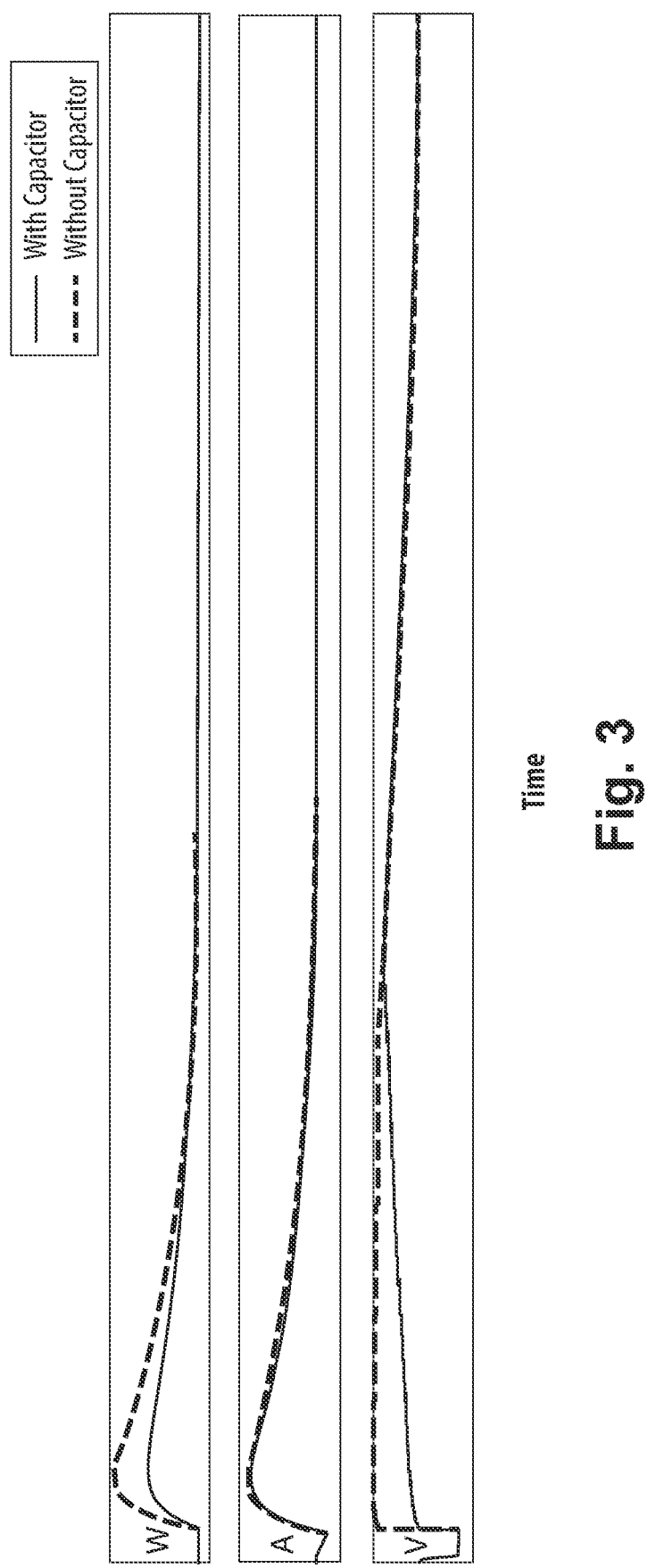
FIG. 3 a set of three graphs showing power dissipation for a Level 4 Waveform 4 Threat for the power system of FIG. 1 and for a similar system without the capacitor for comparison, wherein the top graph plots the transient event in Watts over time, the middle graph plots the event in Amperes over time, and the bottom graph plots the event in Volts over time.

FIG. 3 for a Level 4 Waveform 4 threat shows two traces for each of wattage, amperage, and voltage, wherein the higher trace in each represents performance of the system 100 but without the capacitor 134, and wherein the lower trace in each references performance of the system 100 with the capacitor 134 included. For power dissipation integrated over the time of the transient event shown, the system with the capacitor 134 dissipates at least 29% more power from the FET 102 than does the system 100 without the capacitor 134.

Systems and methods as disclosed herein provide potential benefits including the following. For many applications, the lightning threats are the driving factor in the selection of MOSFETs and in how many MOSFETs are required in parallel in order to survive this level of power dissipation. For the most part, the total energy is more of a driver than the peak power but in some cases the peak power is also a significant factor. The systems and methods in this disclosure can substantially reduce both the peak instantaneous power and the total energy that the MOSFETs have to handle during lightning transients. FIGS. 2-3 show severe examples of DO-160 Level 4 transients and during Waveform 4 the systems and methods of this disclosure can reduce the total energy by more than 2 Joules on a typical 28V SSPC (solid state power controller). This allows designers to use smaller package sized MOSFETs and fewer MOSFETs where traditionally some applications have required 4 or 6 or more in parallel. Overall this can reduce the cost, size, and weight of each SSPC with the addition of only a single capacitor. The systems and methods disclosed herein are applicable to DC SSPC's but can also be applicable with some modifications to AC SSPCs. Application to an AC SSPC configuration is a little more complicated than the DC SSPC but typically the lightning energies on an AC SSPC are one or two orders of magnitude or more higher than the DC SSPC since the voltage are so much higher.

One potential benefit of this disclosure is to speed up the rise time of the shunted current so that the voltage drop across the FET lasts for a shorter time, thus making the integration of the voltage drop across the FET times the current through the FET lower. And by reducing that integral, the total temperature rise of the FET is lower. In addition, the Zener diode, due to internal capacitance, inductance, and other effects does not increase its conduction current as fast as a capacitor. So adding the parallel capacitor allows the FET gate voltage to rise much quicker with the capacitor than without. Thus there is a beneficial circuit characteristic that shortens the time the FET has conduction current through it and voltage drop across it during s lightning event.

The methods and systems of the present disclosure, as described above and shown in the drawings, provide for improved energy dissipation in transient voltage events for power MOSFETS and the like, relative to conventional systems and methods. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A power system comprising:
   a field effect transistor (FET) with a first terminal, a gate terminal, and a third terminal, wherein the first terminal, gate terminal, and third terminal are configured to control electrical current passing between the first terminal and the third terminal based on a voltage of the gate terminal;
   a Zener diode connected in series between a first node and a second node, wherein the first node is connected to the first terminal of the FET and the second node is connected to the gate terminal of the FET, wherein the Zener diode is oriented to allow current through the Zener diode from the first node to the second node only if a voltage difference between the first and second nodes is at or over a Zener voltage of the Zener diode;
   a diode connected in series between the Zener diode and the second node, wherein the diode is oriented to allow current from the first node to the second node and to inhibit current from the second node to the first node; and
   a capacitor connected in parallel with both the Zener diode and the diode between the first and second nodes, wherein the capacitor is configured to raise a gate drive current of the FET during a rising edge of a lightning transient and thereby reduce a voltage drop across the FET faster than the Zener diode is able to do on its own;
   wherein the capacitor is configured to reduce a total amount of energy that the FET must dissipate by 29% or more relative to if the capacitor was not coupled in parallel with the Zener diode.

2. The system as recited in claim 1, wherein the first terminal is a drain of the FET, and wherein the third terminal is a source of the FET.

3. The system as recited in claim 1, wherein the capacitor is configured to reduce the total amount of energy that the FET must dissipate by 29% or more relative to if the capacitor was not coupled in parallel with the Zener diode when the first node is subject to a wave form with a Level 4 Waveform 2 Threat.

4. The system as recited in claim 1, wherein the capacitor is configured to reduce the total amount of energy that the FET must dissipate by 29% or more relative to if the capacitor was not coupled in parallel with the Zener diode when the first node is subject to a wave form with a Level 4 Waveform 4 Threat.

5. The system as recited in claim 1, wherein:
   there are no intervening resistors in a line connecting the first node and the first terminal of the FET;
   there are no intervening capacitors in the line connecting the first node and the first terminal of the FET;
   there are no intervening inductors in the line connecting the first node and the first terminal of the FET;
   there are no intervening transistors in the line connecting the first node and the first terminal of the FET; and
   there are no intervening diodes in the line connecting the first node and the first terminal of the FET.

6. The system as recited in claim 1, wherein:
   there are no intervening resistors in a line connecting the second node and the gate terminal of the FET;
   there are no intervening capacitors in the line connecting the second node and the gate terminal of the FET;
   there are no intervening inductors in the line connecting the second node and the gate terminal of the FET;
   there are no intervening transistors in the line connecting the second node and the gate terminal of the FET; and
   there are no intervening diodes in the line connecting the second node and the gate terminal of the FET.

7. The system as recited in claim 1, wherein the diode represents a non-Zener diode.

8. The system as recited in claim 1, further comprising a load resistance connected to the third terminal.

9. The system as recited in claim 8, wherein the capacitor, Zener diode, and FET are configured to dissipate a lightning strike at the first node by shunting some lightning energy through the FET to the load resistance.

10. The system as recited in claim 8, further comprising a voltage source connected in series between the first node and the load resistance.

11. The system as recited in claim 10, wherein the voltage source is a 28 V source.

12. The system as recited in claim 1, further comprising a voltage source operatively connected to the second node and configured to control the FET during normal operation.

13. The system as recited in claim 12, further comprising a resistor connected in series between the voltage source and the second node.

14. The system as recited in claim 13, wherein the voltage source is connected in series between the resistor and ground.

15. A power system comprising:
   a field effect transistor (FET) with a first terminal, a gate terminal, and a third terminal, wherein the first terminal, gate terminal, and third terminal are configured to control electrical current passing between the first terminal and the third terminal based on a voltage of the gate terminal;
   a Zener diode connected in series between a first node and a second node, wherein the first node is connected to the first terminal of the FET and the second node is connected to the gate terminal of the FET, wherein the Zener diode is oriented to allow current through the Zener diode from the first node to the second node only if a voltage difference between the first and second nodes is at or over a Zener voltage of the Zener diode; and
   a capacitor connected in parallel with the Zener diode between the first and second nodes, wherein the capacitor is configured to raise a gate drive current of the FET during a rising edge of a lightning transient and thereby reduce a voltage drop across the FET faster than the Zener diode is able to do on its own;

wherein the capacitor is configured to reduce a total amount of energy that the FET must dissipate by 29% or more relative to if the capacitor was not coupled in parallel with the Zener diode when the first node is subject to a wave form with a Level 4 Waveform 2 Threat.

16. The system of claim 15, further comprising:

a diode connected in series between the Zener diode and the second node, wherein the diode is oriented to allow current from the first node to the second node and to inhibit current from the second node to the first node;

wherein the capacitor is connected in parallel with both the Zener diode and the diode.

17. The system of claim 16, wherein the diode represents a non-Zener diode.

18. A power system comprising:

a field effect transistor (FET) with a first terminal, a gate terminal, and a third terminal, wherein the first terminal, gate terminal, and third terminal are configured to control electrical current passing between the first terminal and the third terminal based on a voltage of the gate terminal;

a Zener diode connected in series between a first node and a second node, wherein the first node is connected to the first terminal of the FET and the second node is connected to the gate terminal of the FET, wherein the Zener diode is oriented to allow current through the Zener diode from the first node to the second node only if a voltage difference between the first and second nodes is at or over a Zener voltage of the Zener diode; and a capacitor connected in parallel with the Zener diode between the first and second nodes, wherein the capacitor is configured to raise a gate drive current of the FET during a rising edge of a lightning transient and thereby reduce a voltage drop across the FET faster than the Zener diode is able to do on its own;

wherein the capacitor is configured to reduce a total amount of energy that the FET must dissipate by 29% or more relative to if the capacitor was not coupled in parallel with the Zener diode when the first node is subject to a wave form with a Level 4 Waveform 4 Threat.

19. The system of claim 18, further comprising:

a diode connected in series between the Zener diode and the second node, wherein the diode is oriented to allow current from the first node to the second node and to inhibit current from the second node to the first node;

wherein the capacitor is connected in parallel with both the Zener diode and the diode; and wherein the diode represents a non-Zener diode.

20. The system of claim 18, further comprising a load resistance connected to the third terminal;

wherein the capacitor, Zener diode, and FET are configured to dissipate a lightning strike at the first node by shunting some lightning energy through the FET to the load resistance.

* * * * *